(12) United States Patent
Alessandro et al.

(10) Patent No.: US 10,447,268 B2
(45) Date of Patent: Oct. 15, 2019

(54) LEVEL SHIFTER CIRCUIT, CORRESPONDING DEVICE AND METHOD

(71) Applicant: STMicroelectronics S.r.l., Agrate Brianza (MB) (IT)

(72) Inventors: Agatino Antonino Alessandro, Riposto (IT); Ignazio Bruno Mirabella, Scicli (IT)

(73) Assignee: STMicroelectronics S.r.l., Agrate Brianza (MB) (IT)

(*) Notice: Subject to any disclaimer, the term of this patent is extended or adjusted under 35 U.S.C. 154(b) by 0 days.

(21) Appl. No.: 16/112,948

(22) Filed: Aug. 27, 2018

(65) Prior Publication Data

US 2019/0068194 A1    Feb. 28, 2019

(30) Foreign Application Priority Data

Aug. 29, 2017    (IT) .................. 102017000096772

(51) Int. Cl.
*H03K 19/0185*    (2006.01)
*H03K 3/037*    (2006.01)
(Continued)

(52) U.S. Cl.
CPC ..... *H03K 19/018507* (2013.01); *H03K 3/012* (2013.01); *H03K 3/037* (2013.01); *H03K 3/3562* (2013.01); *H03K 3/35613* (2013.01); *H03K 3/356182* (2013.01); *H03K 19/0013* (2013.01); *H03K 19/00338* (2013.01); *H03K 19/20* (2013.01)

(58) Field of Classification Search
CPC .......................................... H03K 19/018507
See application file for complete search history.

(56) References Cited

U.S. PATENT DOCUMENTS 6,043,698 A    3/2000 Hill
8,044,699 B1    10/2011 Kelly
(Continued)

FOREIGN PATENT DOCUMENTS

DE    10357495 A1    7/2005
DE    102007050049 A1    4/2009
EP    3174203 A1    5/2017

OTHER PUBLICATIONS

IT Search Report and Written Opinion for IT Appl. No. 102017000096772 dated Apr. 20, 2018 (9 pages).

*Primary Examiner* — Daniel C Puentes
(74) *Attorney, Agent, or Firm* — Crowe & Dunlevy

(57) ABSTRACT

A level-shifter circuit operates to shift an input signal referenced to a first set supply voltages to generate an output signal referenced to a second set of supply voltages. The output signal from the level-shifter circuit is latched by a latching circuit. A logic gate has a first input configured to receive the input signal, a second input configured to receive a feedback signal and an output coupled to a input of the level shifting circuit. A feedback circuit has a first input configured to receive the output signal, a second input configured to receive the input signal and an output configured to generate the feedback signal. The feedback circuit operates to sense an uncontrolled switching event of the output signal occurring in the absence of a switching of the input signal and apply, in response thereto, the feedback signal to cancel the uncontrolled switching event.

20 Claims, 4 Drawing Sheets

(51) Int. Cl.
    *H03K 3/012*     (2006.01)
    *H03K 19/00*     (2006.01)
    *H03K 3/356*     (2006.01)
    *H03K 3/3562*    (2006.01)
    *H03K 19/003*    (2006.01)
    H03K 19/20       (2006.01)

(56) References Cited

U.S. PATENT DOCUMENTS

| | | |
|---|---|---|
| 8,149,017 B2 | 4/2012 | Knierim |
| 8,686,784 B2 | 4/2014 | Wang |
| 8,717,063 B2 | 5/2014 | Stirk et al. |
| 2011/0037509 A1* | 2/2011 | Herzer ............ H03K 19/01852 327/333 |
| 2011/0115542 A1 | 5/2011 | Koike |
| 2013/0293247 A1 | 11/2013 | Akahane |
| 2014/0247082 A1 | 9/2014 | Gazit |
| 2017/0149434 A1 | 5/2017 | Bianchi et al. |

* cited by examiner

LEVEL SHIFTER CIRCUIT, CORRESPONDING DEVICE AND METHOD

PRIORITY CLAIM

This application claims the priority benefit of Italian Application for Patent No. 102017000096772, filed on Aug. 29, 2017, the content of which is hereby incorporated by reference in its entirety to the maximum extent allowable by law.

TECHNICAL FIELD

The present description relates to level shifter circuits.

One or more embodiments can be used in various applications such as, for example, analog integrated circuit (IC) DC/DC converters, switching of signals, level shifting of digital signals. One or more embodiments may apply to radiation-hardened (rad-hard) integrated circuits, such as, for example, high- and low-side MOSFET driver ICs for use in electronics for space applications or medical devices.

BACKGROUND

Level shifter circuits are extensively used in integrated circuits for transferring signals from a voltage domain to another. Level shifters may be exposed to "false" switching during transitions which should be desirably countered. Making a level shifter fast is another desirable point, which however may involve high current consumption during transitions.

Despite the extensive activity in that area, improved solutions are desirable in order to address various issues. Reducing current consumption in a level shifter with latch operation and facilitating at the same time constant feedback are exemplary of such issues.

SUMMARY

One or more embodiments may relate to a corresponding device (for example, a rad-hard integrated device for use in the applications exemplified previously) as well as to a corresponding method.

The claims are an integral part of the technical teaching provided herein in respect of the embodiments.

One or more embodiments may provide one or more of the following advantages:

increased speed and reduced current consumption, pulse oversizing can be avoided with the capability of following signals with a very small duty-cycle, facilitated continuous reading of input signal levels, which may be useful in a rad-hard environment where ionized particles can cause "false" switching (e.g. undesired uncontrolled switching of a circuit output signal not related to any switching in an input signal to the circuit), output signal level immediately recoverable via feedback, reduced pulse duration.

In an embodiment, a circuit comprises: a first circuit section with a first set of a supply node and a ground, the first circuit section including at least one first switching element configured for receiving switching input signals, a second circuit section with a second set of a supply node and a ground, wherein the second circuit section includes: i) at least one second switching element coupled to the at least one first switching element in the first circuit section, the at least one second switching element in the second circuit section configured for switching as a result of switching of the at least one first switching element in the first circuit section, ii) a latch circuit block driven by the at least one second switching element and having at least one latch output, wherein switching of the at least one latch output is controlled by switching of the at least one second switching element in the second circuit section to provide at the at least one latch output level-shifted replicas of switching input signals applied to the at least one first switching element in the first circuit section, and a feedback network between the at least one latch output and the at least one first switching element in the first circuit section, the feedback network configured for sensing uncontrolled switching events of the at least one latch output occurring in the absence of switching of at least one first switching element in the first circuit section and for applying to the at least one first switching element in the first circuit section forced switching signals to cancel out the uncontrolled switching events at the at least one latch output.

In one or more embodiments, the feedback network may include at least one network branch including: a first transistor and a second transistor arranged with their currents paths in series, the first transistor and the second transistor having control terminals coupled to the at least one latch output and the at least one first switching element to sense said level-shifted replicas and said switching input signals, respectively, and a current sensor sensitive to the current through the current paths of first transistor and the second transistor, the current sensor coupled to the first switching element in the first circuit section to apply thereto said forced switching signals to cancel out the uncontrolled switching events at the at least one latch output.

In one or more embodiments, the at least one network branch in the feedback network may be set between the supply node in the second set of a supply node and a ground and the ground in the first set of a supply node and a ground.

In one or more embodiments, the current sensor may include a resistor traversed by the current through the current paths of the first transistor and the second transistor.

One or more embodiments may include at least one logic gate driving the at least one first switching element in the first circuit section, the at least one logic gate having: a first input for receiving said switching input signals, and a second input coupled to the feedback network and configured for receiving therefrom said forced switching signals.

In one or more embodiments, the at least one logic gate may include an AND gate having: a first input for receiving said switching input signals, and a second input coupled to the feedback network and configured for receiving therefrom said forced switching signals.

In one or more embodiments: the first circuit section may include a pair of said first switching elements configured for receiving pairs of complementary switching input signals, the second circuit section may include a pair of said second switching elements each one coupled to a respective one of the first switching elements in the first circuit section, the second switching elements in the second circuit section configured for switching as a result of switching of the respective first switching elements in the first circuit section, the latch circuit block includes a pair of complementary latch outputs, wherein switching of the latch outputs is controlled by switching of respective first switching element in the first circuit section to provide at the latch outputs level-shifted replicas of switching input signals applied to the first switching elements in the first circuit section, and the feedback network is configured for sensing uncontrolled switching events of the latch outputs occurring in the absence of switching of the respective first switching elements in the first circuit section and for applying to the first switching elements in the first circuit section forced switching signals to cancel out the uncontrolled switching events at the latch outputs.

In one or more embodiments, a device may include: a circuit according to one or more embodiments, and a user circuit coupled to said latch circuit block to receive therefrom said level-shifted replicas of switching input signals applied to the at least one first switching element in the first circuit section.

In one or more embodiments, the device may include a radiation-hardened integrated circuit device.

In one or more embodiments, a method may include: providing a circuit according to one or more embodiments, applying switching input signals to the at least one first switching element in the first circuit section of the circuit, collecting at the at least one latch output of the latch circuit block in the second circuit section of the circuit level-shifted replicas of said switching input signals.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
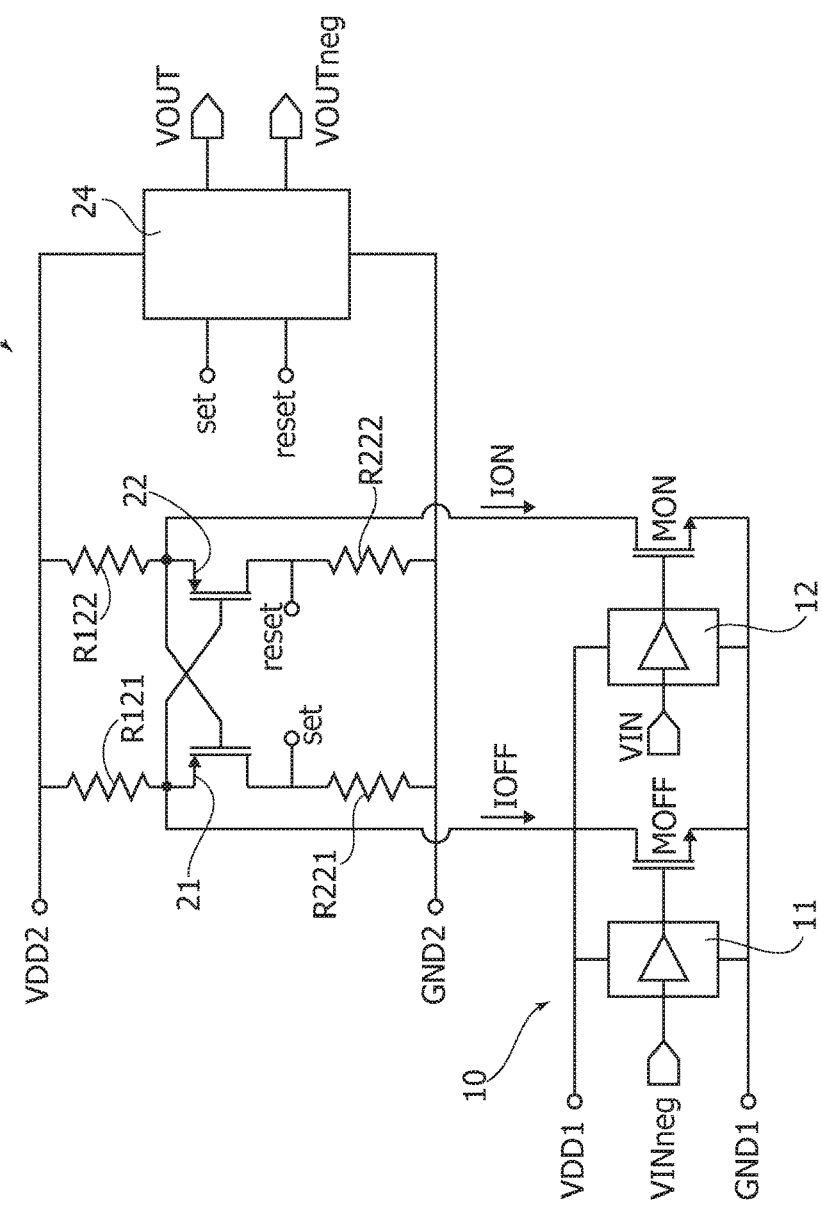
FIG. 1 is a block diagram of a level shifter including a latch.

FIG. 1 is exemplary of a conventional level shifter circuit with a latch circuit block.

The circuit exemplified in FIG. 1 includes:

a first circuit section 10 coupled between a first supply line at a voltage VDD1 and a first ground GND1, and a second (e.g. upward) "level shifted" circuit section 20 coupled between a second supply line at a voltage VDD2 and a second ground GND2, with an associated output latch circuit 24 (hereinafter, briefly, latch 24).

As shown in FIG. 1, the first circuit section 10 includes two input circuit stages 11, 12 configured for receiving complementary versions VINneg (negated) and VIN (non-negated) of a logical input signal VIN and driving two transistors MOFF, MON (e.g. MOSFET transistors) via their control terminals (e.g. their gates, in the case of field-effect transistors such as MOSFET transistors).

The signal paths (e.g. source-drain, in the case of field-effect transistors such as MOSFET transistors) of the transistors MOFF and MON are coupled to the level shifted section 20 with the capability of drawing therefrom (as a result of the MOFF or MON becoming conductive) respective currents IOFF and ION.

As shown in FIG. 1, the signal paths of the transistors MOFF and MON are coupled to the signal paths of two transistors 21, 22 (e.g. MOSFET transistors) in the level shifted section 20.

As shown in FIG. 1:

the transistor 21 is arranged with its current path (e.g. source-drain, in the case of field-effect transistor such as MOSFET transistors) extending between the second supply line at voltage VDD2 and the second ground GND2 with an "upper" bias resistor R121 between the second supply line at voltage VDD2 and the transistor 21 and a "lower" bias resistor R221 between the transistor 21 and the second ground GND2, the transistor 22 is arranged with its current path (e.g. source-drain, in the case of field-effect transistors such as MOSFET transistors) extending between the second supply line at voltage VDD2 and the second ground GND2 with an "upper" bias resistor R122 between the second supply line at voltage VDD2 and the transistor 22 and a "lower" bias resistor R222 between the transistor 22 and the second ground GND2, As shown in FIG. 1 the two transistors 21, 22 are coupled in a bi-stable configuration, with the control terminal (e.g. the gate, in the case of field-effect transistors such as MOSFET transistors) of the transistor 21 or transistor 22 coupled in a cross-wise fashion with the current path of the transistor 22 or transistor 21, respectively, at the nodes (e.g. source, in the case of field-effect transistors such as MOSFET transistors) to which the "upper" resistors R121, R122 are coupled, these nodes being also the nodes at which the transistors MOFF, MON in the first circuit section 10 are coupled to the second section 20.

As shown in FIG. 1, the signals at the nodes between the transistors 21 22 and the "lower" resistors R221, R222 (which nodes/signals are denoted set and reset in FIG. 1) are applied to homologous set/reset inputs of the latch 24 which provides complementary output logic signals VOUT (non-negated) and VOUTneg (negated).

Figure 2:
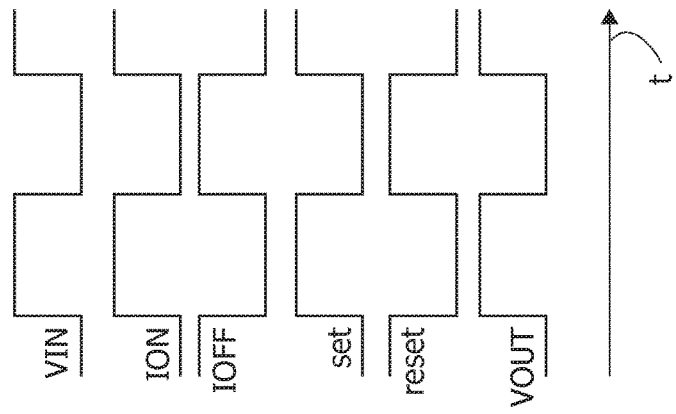
FIG. 2 is exemplary of certain signals which may occur in a level shifter as exemplified in FIG. 1.

The diagrams of FIG. 2 are exemplary of the possible coordinated (that is, with the same time abscissa) of the following signals:

VIN (input to the stages 11 and 12, in negated form for the stage 11),

ION and IOFF (currents drawn from the second section 20 by the first circuit section 10), set and reset (as applied to the latch 24 from the transistors 21, 22), and VOUT (as output from the latch 24, possibly also in negated form as VOUTneg).

Operation of a circuit as shown in FIG. 1 may involve turning on and off MON and MOFF alternatively (via VIN and VINneg) to generate set-reset signals which control the latch 24 as desired, that is to produce signals at its outputs VOUT, VOUTneg that are level-shifted replicas of VIN, VINneg.

Selecting high values for the currents ION and IOFF in order to facilitate speeding-up signal transfer increases current consumption, which may not be desirable for certain applications.

Figure 4:
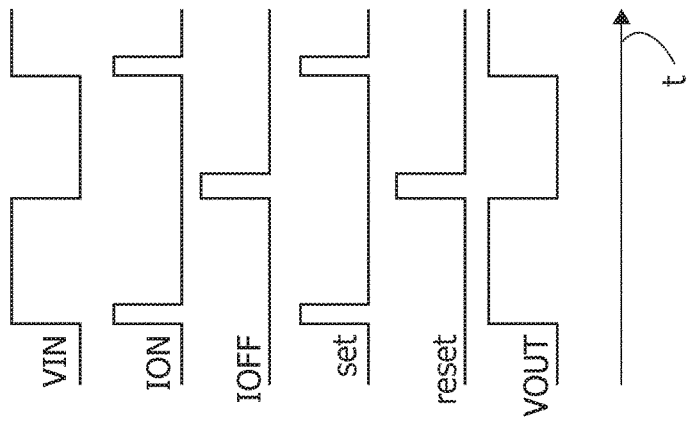
FIG. 4 is exemplary of certain signals which may occur in a level shifter as exemplified in FIG. 3.
Figure 3:
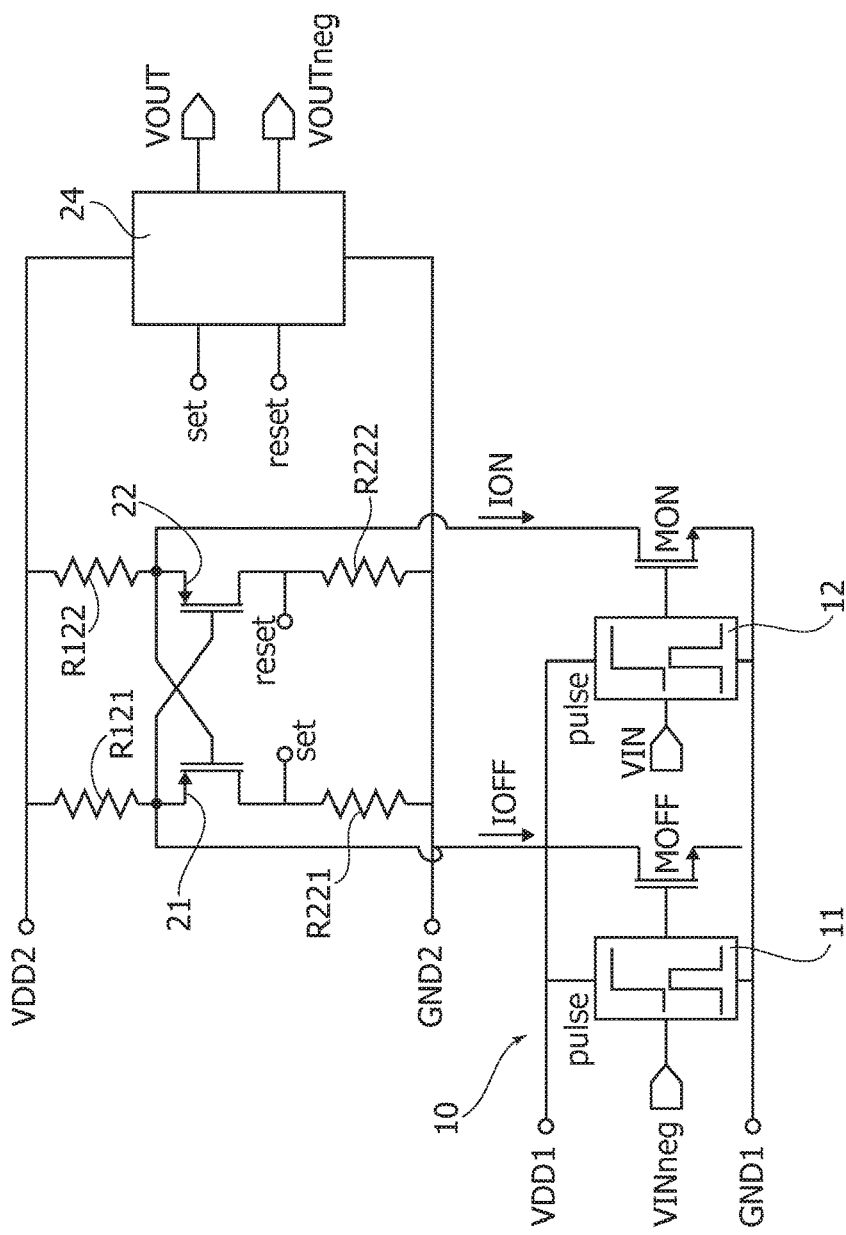
FIG. 3 is a another block diagram of a level shifter including a latch.

FIGS. 3 and 4 (where parts or elements like parts or elements already discussed in connection with FIGS. 1 and 2 are indicated with like references, so that a corresponding description will not be repeated for brevity) are exemplary of an approach which facilitates achieving a (very) fast transient together with reduced quiescent consumption.

As shown in the diagrams of FIG. 4, the transistors MON and MOFF can be driven in such a way to produce the currents ION, IOFF as short pulses in the place of the "true" signals shown in FIG. 2.

It was noted that the arrangement of FIGS. 3 and 4 involve certain drawbacks.

For instance, making switching of the level shifter possible in any operating condition may involve oversizing pulse duration, which in turn may make signals with a very short duty cycle difficult to follow. Moreover, if, for any reasons, the latch (e.g. 24 in FIG. 3) loses the related information, the output signal becomes permanently wrong until the next switching (commutation). In fact, when resorting to the "pulsed" technique of FIGS. 3 and 4, a continuous reading phase of the input signal may be difficult to achieve.

In FIGS. 5 to 8 parts or elements like parts or elements already discussed in connections with the previous figures are indicated with like references: a corresponding description will not be repeated for brevity.

FIGS. 5 to 8 are exemplary of one or more embodiments where these issues are addressed by means of a feedback network 30 coupled with the latch 24 in order to transfer the output signal (e.g. VOUT, VOUTneg) back to the input of the first circuit section 10, namely towards the control terminals (e.g. gates) of the transistors MOFF and MON.

Figure 5:
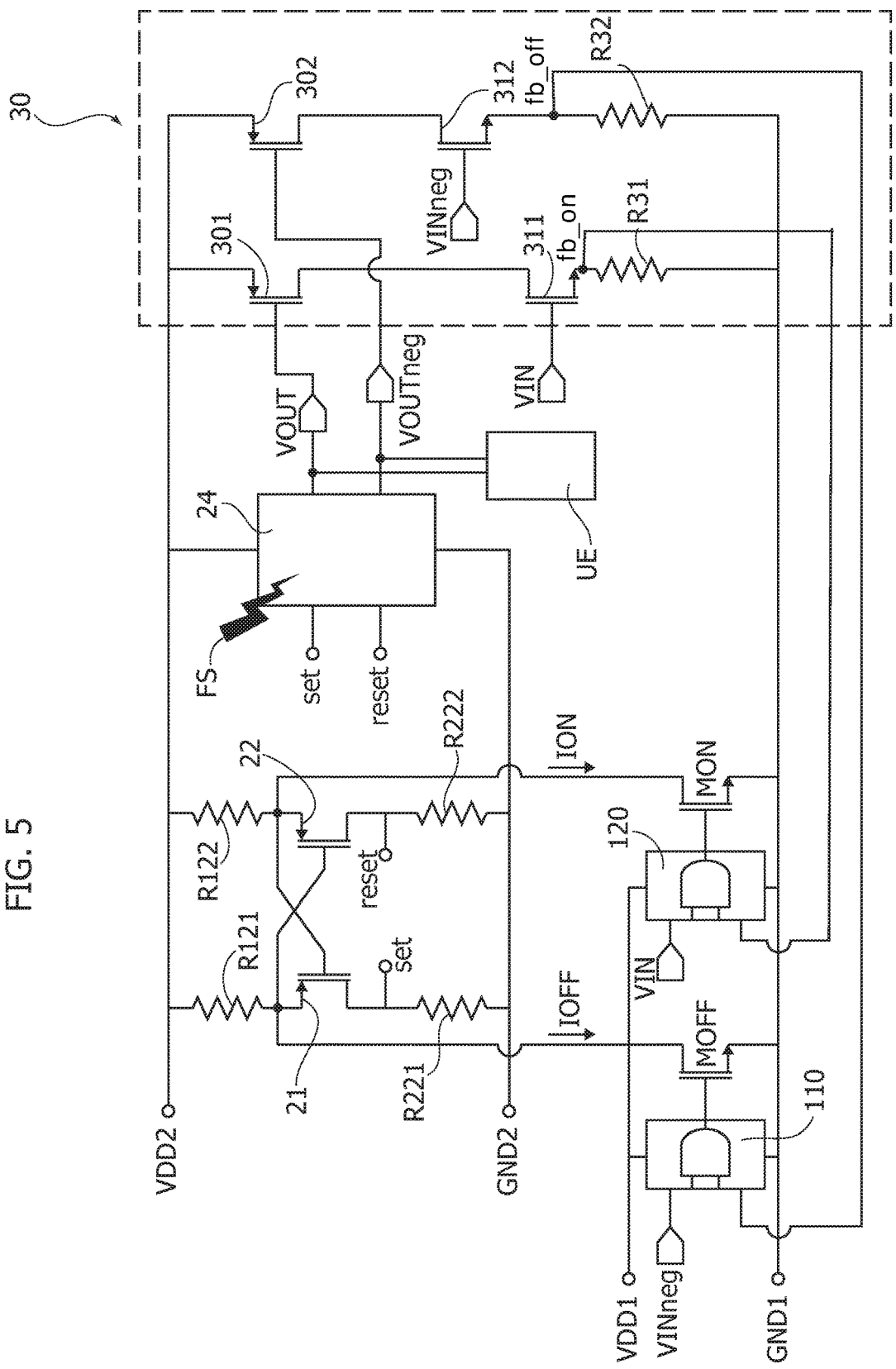
FIG. 5 is a block diagram exemplary of embodiments.

In one or more embodiments as exemplified in FIG. 5, the feedback network 30 may include two branches arranged in parallel between the second supply line (voltage VDD2) and the first ground GND1.

Each of the branches exemplified in FIG. 5 includes a first transistor (e.g. a MOSFET transistor) 301, 302 arranged with its current path (source-drain, in the case of field-effect transistors such as MOSFET transistors) extending between the second supply line at voltage VDD2 and a second transistor (e.g. a MOSFET transistor) 311, 312 arranged with its current path (source-drain, in the case of field-effect transistors such as MOSFET transistors) in series with the current path of the first transistor 301, 302. The output signal(s) VOUT, VOUTneg from the latch 24 are applied to the control terminals (gates, in the case of field-effect transistors such as MOSFET transistors) of the transistors 301, 302.

In one or more embodiments as exemplified in FIG. 5, the control terminal (gate, in the case of field-effect transistors such as MOSFET transistors) of the second transistor 311, 312 receives a corresponding input signal, that is:

VIN for the transistor 311 in the branch to which VOUT is applied via the transistor 301; and VINneg for the transistor 312 in the branch to which VOUTneg is applied via the transistor 302.

Each of the branches exemplified in FIG. 5 also includes a resistor R31, R32 between the second transistor 311, 312 and the (first) ground GND1.

Feedback signals fb_on, fb_off sensed across the resistors R31 and R32 are fed back towards the transistors MOFF and MON in the first circuit section 10.

The resistors R31 and R32 can be assumed to be traversed by currents substantially equal to the currents flowing in the current paths through the transistors 301, 311 and 302, 312, respectively, since the current drawn by the feedback lines sensing fb_on and fb_off are de facto negligible.

In one or more embodiments as exemplified in FIG. 5, a current will flow through R31 as a result of VIN going "high" with VOUT not yet switched to "high". The current will thus flow through R31 for a short time with a value depending on the value of VIN and the resistance value (of R31). The same will also apply to R32, with the current practically negligible insofar as it will flow for a (very) short interval.

In one or more embodiments as exemplified in FIG. 5, the control terminals (gates, in the case of field-effect transistors such as MOSFET transistors) of the transistors MOFF and MON are driven via respective AND gates 110, 120 receiving:

the signal VINneg, or VIN, respectively, as a first input, and a corresponding feedback signal fb_off, fb_on on a second input.

In one or more embodiments as exemplified in FIG. 5, the transistor MON will be turned on as a result of VIN going "high" with VOUT still "low" (which will be mirrored by fb_on as soon as VIN goes high).

In one or more embodiments as exemplified in FIG. 5, due to logical product performed in the gates 110, 120, each of the transistors MOFF, MON will be switched "on" (that is made conductive) as a result of both the signals at the inputs of the associated AND gate 110, 120 (that is, VINneg and fb_off for MOFF and VIN and fb_on for MON) being at a high logical level.

A possible switching sequence in one or more embodiments as exemplified in FIG. 5 may thus include:

VIN being "low", with VOUT correspondingly "low", with the transistor 301 "on" (conductive) while the transistor 311 is "off" (non-conductive), with a voltage essentially corresponding to VDD2 at the drain of the transistor 311;

VIN switching from "low" to "high", with VOUT still having to switch and the transistor 301 still "on", while the transistor 311 turns "on" (becoming conductive) and transfers voltage to the signal fb_on, which goes to "high", so that the AND gate 120 will have both inputs "high" and will be capable of turning on the transistor MON;

as a result of the transistor MON being turned on the latch 24 will change direction and lift VOUT to "high", so that the transistor 301 will be turned off with the transistor 311 remaining and the resistor R31 discharging fb_on by leading it to ground;

even with VIN remaining "high", as a result of VOUT having switched, fb_on will be "low" and the AND gate 120 will turn off the transistor MON, by correspondingly reducing power consumption.

One or more embodiments as exemplified in FIG. 5 make it possible to combine two advantages, namely pulse driving and constant input signal reading.

Figure 6:
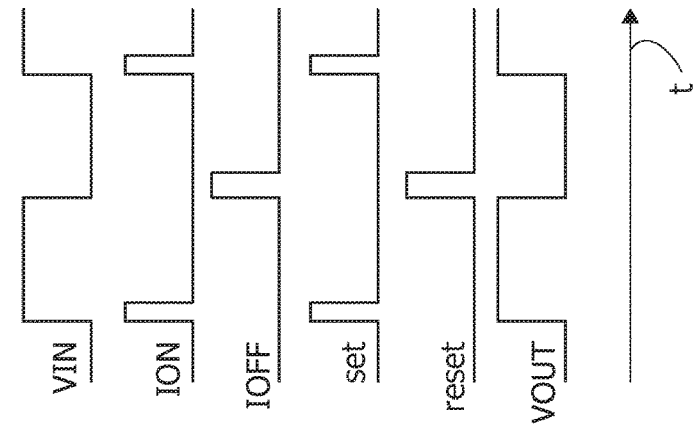

Pulse driving of the circuit of FIG. 5 is exemplified in the diagrams in FIG. 6 which exemplify (with reference to a common time scale) the possible time behavior of the following signals:

VIN (VINneg being the negated version thereof),
ION,
IOFF,
set,
reset,
VOUT (VOUTneg being the negated version thereof.

One or more embodiments facilitate achieving an adequate signal transfer speed through the level shifter circuit, without oversizing the input pulses while also facilitating correct transfer of signals between the circuit input and output.

Figure 8:
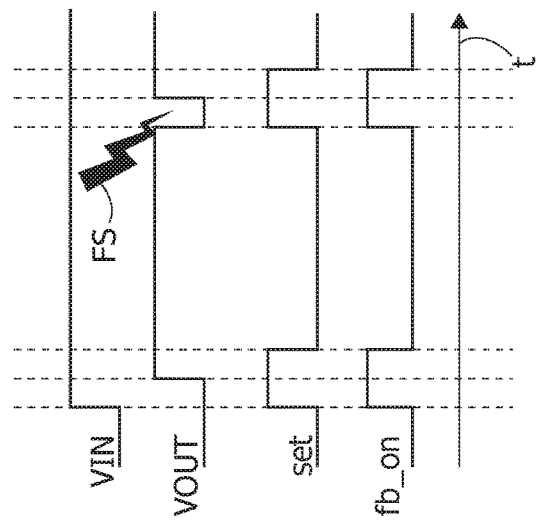
FIGS. 6 to 8 are exemplary of certain signals which may occur in one or more embodiments.
Figure 7:
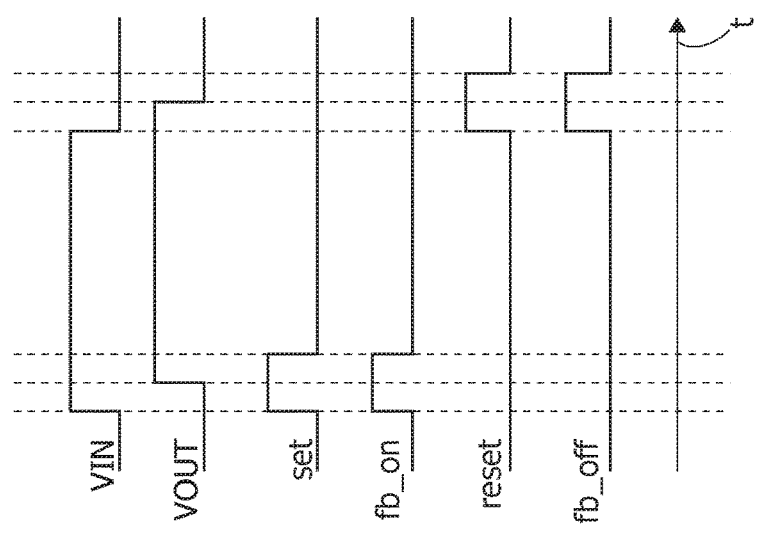

In FIGS. 7 and 8 "regular" switching operation (FIG. 7) is compared against "wrong" or "false" switching (FIG. 8) as induced (for example) by noise, by a radiation event, and so on as indicated by FS in FIGS. 5 and 8.

In regular switching operation as exemplified in FIG. 7, switching in VIN is followed by a controlled (desired) switching in VOUT, with the signals set, fb_on, reset and fb_off exhibiting the time behavior as shown in FIG. 7.

Conversely, FIG. 8 is exemplary of an undesired change occurring—for any reasons (noise, radiation event . . . )—in the output VOUT (taken as an example) as induced (for example) by FS in FIG. 5.

In that case, the reaction of feedback network 30 to such an undesired change, as mirrored by the signals set and fb_on, will cause the circuit to change again the output state, bringing it back to the correct value.

One or more embodiments can therefore combine the advantages of pulse driving (for example, speed and low current consumption) while making it possible to avoid undesired "oversizing" of the pulses, so that also (very) small duty cycle signals can be effectively followed.

Also, one or more embodiments facilitate continuous reading of the input signal levels. This can be particularly valued in a rad-hard environment where ionized particles can hit the latch, thus causing undesired uncontrolled "false" switching. Resorting to a feedback technique facilitates immediate recovery of the output signal level, while the duration of the pulses can be further (reduced) by targeting a (very) low value while preserving operation as desired.

A circuit according to one or more embodiments may include:

a first circuit section (e.g. 10) with a first set of a supply node (e.g. VDD1) and a ground (e.g. GND1), the first circuit section including at least one first switching element (e.g. MOFF, MON) configured for receiving switching input signals (e.g. VIN, VINneg), a second circuit section (e.g. 20) with a second set of a supply node (e.g. VDD2) and a ground (e.g. GND2), the second circuit section including:

i) at least one second switching element (e.g. 21, 22) coupled (see e.g. the currents IOFF, ION) to the at least one first switching element in the first circuit section, the at least one second switching element in the second circuit section configured for switching (see e.g. the set, reset signals) as a result of switching of the at least one first switching element in the first circuit section, ii) a latch circuit block (e.g. 24) driven by the at least one second switching element and having at least one latch output (e.g. VOUT, VOUTneg), wherein switching of the at least one latch output is controlled by switching of the at least one second switching element in the second circuit section to provide at the at least one latch output level-shifted replicas of switching input signals applied to the at least one first switching element in the first circuit section, and a feedback network (e.g. 30) between the at least one latch output and the at least one first switching element in the first circuit section, the feedback network configured for sensing (see e.g. the transistors 301, 302, 311, 312) uncontrolled ("false") switching events (FS) of the at least one latch output occurring in the absence of switching of at least one first switching element in the first circuit section and for applying (e.g. via the gates 110, 120) to the at least one first switching element in the first circuit section forced switching signals to cancel out the uncontrolled switching events at the at least one latch output.

In one or more embodiments, the feedback network may include at least one network branch including:

a first transistor (e.g. 301, 302) and a second transistor (e.g. 311, 312) arranged with their currents paths (e.g. source-drain, in the case of field-effect transistors) in series, the first transistor and the second transistor having control terminals (e.g. gates, in the case of field-effect transistors) coupled to the at least one latch output and the at least one first switching element to sense said level-shifted replicas and said switching input signals, respectively, and a current sensor (e.g. R31, R32) sensitive to the current through the current paths of first transistor and the second transistor, the current sensor coupled (e.g. via the gates 110, 120) to the first switching element in the first circuit section to apply thereto said forced switching signals to cancel out the uncontrolled switching events at the at least one latch output.

In one or more embodiments, the at least one network branch in the feedback network may be set between the supply node (e.g. VDD2) in the second set of a supply node and a ground and the ground (e.g. GN1) in the first set of a supply node and a ground.

In one or more embodiments, the current sensor may include a resistor traversed by the current through the current paths of the first transistor and the second transistor.

One or more embodiments may include at least one logic gate (e.g. 110, 120) driving the at least one first switching element in the first circuit section, the at least one logic gate having:

a first input for receiving said switching input signals, and
a second input coupled to the feedback network and configured for receiving therefrom said forced switching signals.

In one or more embodiments, the at least one logic gate may include an AND gate having:

a first input for receiving said switching input signals, and
a second input coupled to the feedback network and configured for receiving therefrom said forced switching signals.

In one or more embodiments:

the first circuit section may include a pair of said first switching elements configured for receiving pairs of complementary switching input signals, the second circuit section may include a pair of said second switching elements each one coupled to a respective one of the first switching elements in the first circuit section, the second switching elements in the second circuit section configured for switching as a result of switching of the respective first switching elements in the first circuit section, the latch circuit block includes a pair of complementary latch outputs, wherein switching of the latch outputs is controlled by switching of respective first switching element in the first circuit section to provide at the latch outputs level-shifted replicas of switching input signals applied to the first switching elements in the first circuit section, and the feedback network is configured for sensing uncontrolled switching events of the latch outputs occurring in the absence of switching of the respective first switching elements in the first circuit section and for applying to the first switching elements in the first circuit section forced switching signals to cancel out the uncontrolled switching events at the latch outputs.

In one or more embodiments, a device may include:
a circuit according to one or more embodiments, and
a user circuit (UE, e.g. as exemplified in the introductory portion of the description) coupled to said latch circuit block to receive therefrom said level-shifted replicas of switching input signals applied to the at least one first switching element in the first circuit section.

In one or more embodiments, the device may include a radiation-hardened integrated circuit device.

In one or more embodiments, a method may include:
providing a circuit according to one or more embodiments,
applying switching input signals to the at least one first switching element in the first circuit section of the circuit,
collecting at the at least one latch output of the latch circuit block in the second circuit section of the circuit level-shifted replicas of said switching input signals.

Without prejudice to the underlying principles, the details and embodiments may vary, even significantly, with respect to what has been described by way of example only, without departing from the extent of protection.

The extent of protection is defined by the annexed claims.

The invention claimed is:

1. A circuit, including:
a first circuit comprising a first logic circuit receiving a switching input signal and being powered between a first supply voltage and a first reference voltage, the first circuit also including at least one first switching element configured for receiving output from the first logic circuit and being powered between a second supply voltage and the first reference voltage,
a second circuit powered between the second supply voltage and a second reference voltage, the first supply voltage being different than the second supply voltage, the first reference voltage being different than the second reference voltage, wherein the second circuit includes:
i) at least one second switching element having a source coupled to a drain of the at least one first switching element in the first circuit, wherein switching of the at least one second switching element is controlled by switching of the at least one first switching element in the first circuit, and
ii) a latch circuit block driven by the at least one second switching element and having at least one latch output, wherein switching of the at least one latch output is controlled by switching of the at least one second switching element in the second circuit to provide at least one latch output level-shifted replica of the switching input signal applied to the at least one first switching element in the first circuit, and
a feedback network between the at least one latch output and the at least one first switching element in the first circuit, the feedback network configured for sensing uncontrolled switching events of the at least one latch output occurring in the absence of switching of at least one first switching element in the first circuit and for applying to the at least one first switching element in the first circuit a forced switching signal to cancel out the uncontrolled switching events at the at least one latch output.

2. The circuit of claim 1, wherein the feedback network includes at least one network branch including:
a first transistor and a second transistor arranged with their currents paths in series, the first transistor and the second transistor having control terminals coupled to the at least one latch output and the at least one first switching element to sense said level-shifted replica and said switching input signal, respectively, and
a current sensor sensitive to the current through the current paths of first transistor and the second transistor, the current sensor coupled to the at least one first switching element in the first circuit to apply thereto said forced switching signal to cancel out the uncontrolled switching events at the at least one latch output.

3. The circuit of claim 2, wherein the at least one network branch in the feedback network is set between:
the second supply voltage, and
the first reference voltage.

4. The circuit of claim 2, wherein the current sensor includes a resistor traversed by the current through the current paths of the first transistor and the second transistor.

5. The circuit of claim 1, wherein the first logic circuit comprises a logic gate having an output driving the at least one first switching element in the first circuit, the logic gate also having:
a first input for receiving said switching input signal, and
a second input coupled to the feedback network and configured for receiving therefrom said forced switching signal,
wherein an output signal at the output of the logic gate is a result of a logical AND operation between the switching input signal and the forced switching signal.

6. The circuit of claim 5, wherein the logic gate includes an AND gate having:
a first input for receiving said switching input signal, and
a second input coupled to the feedback network and configured for receiving therefrom said forced switching signal.

7. The circuit of any claim 1, wherein:
the first circuit includes a pair of said first switching elements configured for receiving a pair of complementary switching input signals,
the second circuit includes a pair of said second switching elements respectively coupled to the pair of first switching elements in the first circuit, the second switching elements in the second circuit configured for switching as a result of switching of the respective first switching elements in the first circuit,
the latch circuit block includes a pair of complementary latch outputs, wherein switching of the latch outputs is controlled by switching of respective second switching elements to provide at the pair of complementary latch outputs level-shifted replicas of switching input signals applied to the first switching elements in the first circuit, and
the feedback network is configured for sensing uncontrolled switching events of the pair of complementary latch outputs occurring in the absence of switching of the respective first switching elements in the first circuit and for applying to the first switching elements in the first circuit forced switching signals to cancel out the uncontrolled switching events at the latch outputs.

8. The circuit of claim 1, further comprising a user circuit coupled to said latch circuit block to receive therefrom said level-shifted replica of switching input signal applied to the at least one first switching element in the first circuit.

9. The circuit of claim 8, forming a radiation-hardened integrated circuit device.

10. The circuit of claim 1, wherein the at least one second switching element has a source directly electrically connected to the drain of the at least one first switching element in the first circuit.

11. A circuit, comprising:
a level shifting circuit configured to shift an input signal referenced to a first set of a supply node and a ground to generate an output signal referenced to a second set of a supply node and a ground and latched by a latching circuit;
a logic gate having a first input configured to receive the input signal, a second input configured to receive a feedback signal and an output coupled to a input of the level shifting circuit;
a feedback circuit having a first input configured to receive the output signal, a second input configured to receive the input signal and an output configured to generate the feedback signal, wherein the feedback circuit operates to sense an uncontrolled switching event of the output signal occurring in the absence of a switching of the input signal and apply, in response thereto, the feedback signal to cancel the uncontrolled switching event;
wherein the feedback circuit comprises:
a first transistor and a second transistor having current paths coupled in series, wherein a control terminal of the first transistor is configured to receive the output signal and wherein a control terminal of the second transistor is configured to receive the input signal; and
a current sensor configured to sense current flow through the current paths of first transistor and the second transistor and generate said feedback signal in response to the sensed current flow.

12. The circuit of claim 11, wherein the first and second transistors coupled in series are coupled between the supply node in the second set and the ground in the first set.

13. The circuit of claim 11, wherein the current sensor is a resistor traversed by the current flow through the current paths of the first transistor and the second transistor.

14. The circuit of claim 11, wherein the logic gate is an AND gate.

15. A circuit, including:
a first circuit comprising a first logic circuit receiving a switching input signal and being powered between a first supply voltage and a first reference voltage, the first circuit also including at least one first switching element configured for receiving output from the first logic circuit and being powered between a second supply voltage and the first reference voltage,
a second circuit powered between the second supply voltage and a second reference voltage, the first supply voltage being different than the second supply voltage, the first reference voltage being different than the second reference voltage, wherein the second circuit includes:
i) at least one second switching element having a source coupled to a drain of the at least one first switching element in the first circuit, and
ii) a latch circuit block driven by the at least one second switching element and having at least one latch output, and
a feedback network between the at least one latch output and the at least one first switching element in the first circuit, the feedback network configured for applying to the at least one first switching element in the first circuit a forced switching signal to cancel out uncontrolled switching events at the at least one latch output.

16. The circuit of claim 15, wherein the feedback network includes at least one network branch including:
a first transistor and a second transistor arranged with their currents paths in series, the first transistor and the second transistor having control terminals coupled to the at least one latch output and the at least one first switching element, and
a current sensor sensitive to the current through the current paths of first transistor and the second transistor, the current sensor coupled to the at least one first switching element in the first circuit to apply thereto said forced switching signal to cancel out the uncontrolled switching events at the at least one latch output.

17. The circuit of claim 16, wherein the at least one network branch in the feedback network is set between:
the second supply voltage, and
the first reference voltage.

18. The circuit of claim 16, wherein the current sensor includes a resistor traversed by the current through the current paths of the first transistor and the second transistor.

19. The circuit of claim 16, wherein the first logic circuit comprises an AND gate having an output driving the at least one first switching element in the first circuit, the AND gate also having:
a first input for receiving said switching input signal, and
a second input coupled to the feedback network and configured for receiving therefrom said forced switching signal.

20. The circuit of claim 16, wherein the at least one second switching element has a source directly electrically connected to the drain of the at least one first switching element in the first circuit.

* * * * *